(12) United States Patent
Wang et al.

(10) Patent No.: US 12,732,338 B2

(45) Date of Patent: Sep. 8, 2026

(54) CLOCK DATA RECOVERY CIRCUIT AND PHASE SELECTOR/PHASE INTERPOLATOR CIRCUIT THEREOF, AND ELECTRONIC DEVICE

(71) Applicant: SMARTSENS TECHNOLOGY (HK) CO., LIMITED, Kowloon (CN)

(72) Inventors: Yunqi Wang, Shanghai (CN); Qiuwei Wu, Shanghai (CN)

(73) Assignee: SMARTSENS TECHNOLOGY (HK) CO., LIMITED, Kowloon (CN)

( * ) Notice: Subject to any disclaimer, the term of this patent is extended or adjusted under 35 U.S.C. 154(b) by 18 days.

(21) Appl. No.: 18/980,710

(22) Filed: Dec. 13, 2024

(65) Prior Publication Data

US 2025/0293848 A1 Sep. 18, 2025

(30) Foreign Application Priority Data

Mar. 12, 2024 (CN) ......................... 202410281696.3

(51) Int. Cl.

| | |
|---|---|
| ***H04L 7/033*** | (2006.01) |
| ***H03K 5/00*** | (2006.01) |
| ***H03K 5/135*** | (2006.01) |
| ***H03L 7/08*** | (2006.01) |
| ***H04L 7/00*** | (2006.01) |

(52) U.S. Cl.

CPC ............ *H04L 7/002* (2013.01); *H03K 5/135* (2013.01); *H03L 7/0807* (2013.01); *H03K 2005/00052* (2013.01)

(58) Field of Classification Search

CPC ..... H04L 7/033; H04L 7/0008; H04L 7/0025; H04L 7/0037; H04L 27/2007; H04L 7/0338; H04L 7/002; H04L 7/0012; H04B 1/02; H04B 1/04; H04B 1/0475; H04B 15/04; H04B 2215/064; H04B 2215/067; H04B 1/38; H04B 3/04; G06F 13/1689; G06F 1/324; G06F 1/12; G06F 1/3225; G06F 1/3237; G06F 12/0857; G06F 13/36; G06F 2201/88

See application file for complete search history.

(56) References Cited

U.S. PATENT DOCUMENTS 9,059,837 B1 * 6/2015 Tsunoda .................. H04L 7/033
9,379,720 B1 * 6/2016 Xu ......................... H04L 7/0337
9,793,884 B2 * 10/2017 Ma ....................... H03K 5/1565

(Continued)

*Primary Examiner* — Eva Y Puente

(74) *Attorney, Agent, or Firm* — Brooks Kushman P.C.

(57) ABSTRACT

A phase selector/phase interpolator circuit which includes two phase selector circuits and one phase interpolator circuit, each phase selector circuit includes N first tail current tubes, N phase selector units, a current source circuit and a comparison circuit. The current source circuit is selected as a load of the phase selector circuit. The comparison circuit compares a common-mode voltage of the two output clock signals output from the phase selector unit with a reference voltage, and performs negative feedback regulation on the first bias voltage of the first tail current tubes, so that the common-mode voltage can be controlled to be equal to the reference voltage, a tail current of the first tail current tubes is controlled to be equal to the current of the current source circuit, and the output waveform becomes a linear triangular wave.

20 Claims, 9 Drawing Sheets

(56) References Cited

U.S. PATENT DOCUMENTS

2005/0238126 A1* 10/2005 Ribo ....................... H03L 7/091
375/326
2014/0111257 A1* 4/2014 Ying ...................... H03K 3/013
327/117
2017/0187361 A1* 6/2017 Tai ........................ H03L 7/0807

* cited by examiner

CLOCK DATA RECOVERY CIRCUIT AND PHASE SELECTOR/PHASE INTERPOLATOR CIRCUIT THEREOF, AND ELECTRONIC DEVICE

CROSS-REFERENCE TO RELATED APPLICATION

Pursuant to 35 U.S.C. § 119 and the Paris Convention, this application claims the benefit of Chinese Patent Application No. 202410281696.3 filed on Mar. 12, 2024, the content of which is incorporated herein by reference.

TECHNICAL FIELD

The present application relates to the field of clock data recovery technology, more particularly to a clock data recovery circuit and a phase selector/phase interpolator circuit thereof, and an electronic device.

BACKGROUND

The statements provided herein are merely background information related to the present application, and do not necessarily constitute any prior arts. The clock data recovery (CDR) circuit is an important component of the transmitter in the serializer system. The quality of the clock recovered by the clock data recovery circuit directly affects the data collection of the transmitter, and then affects core indicators such as a transmission rate and a bit error rate. The phase selector/phase interpolator (PS-PI) circuit is a key module in the clock data recovery circuit, and the interpolation accuracy of the phase selector/phase interpolator circuit has a great influence on the quality of clock output from the clock data recovery circuit.

The phase selector/phase interpolator circuit includes two phase selector circuits and a phase interpolator circuit. Each phase selector circuit receives multiple clock signals, selects two of the clock signals according to a code signal and outputs the same to the phase interpolator circuit. The phase interpolator circuit performs linear interpolation on the two clock signals received to output a clock signal whose phase is between the two clock signals.

Among them, a conventional phase selector circuit is shown in FIG. 1, the two leftmost transistors are switched on when SA=0001, at this time, the clock signal output from the phase selector circuit is a clock signal having the same phase as CLK90, where CLKX is a phase difference of X degrees from the reference clock. FIG. 2 shows waveforms of various signals when the phase selector circuit and the phase interpolator circuit are in operation, where CKa and CKb are the clock signals output from the two phase selector circuits, and CKO is the clock signal output from the phase interpolator circuit. Since the load in the phase selector circuit is a resistor, the output node waveform satisfies the RC charging characteristic, that is, first fast and then slow, thus the nonlinearity of the output signal is introduced. This nonlinearity will cause errors in phase interpolation, as shown in FIG. 3, and ultimately lead to an increase in the jitter of the clock signal output from the clock data recovery circuit.

SUMMARY

An objective of the present application to provide a phase selector/phase interpolator circuit, which aims to solve the problem of clock jitter in the traditional clock data recovery circuit.

In accordance with a first aspect of the embodiments of the present application, a phase selector/phase interpolator circuit of a clock data recovery circuit is provided, which includes two phase selector circuits and one phase interpolator circuit.

The two phase selector circuits are respectively connected to a controller of the clock data recovery circuit, each of the two phase selector circuits is configured to select and output one of N first clock signals of different phases received according to a first code signal output by the controller, where N≥2.

The phase selector circuit includes: N first tail current tubes, N phase selector units, a current source circuit and a comparison circuit.

The N first tail current tubes are respectively configured to output a tail current of corresponding magnitude according to a first bias voltage. The tail current changes in a positive correlation with the first bias voltage.

Each of the N phase selector units is connected to one of the N first tail current tubes and two output ends of the phase selector circuit, and every two of the phase selector units receive two first clock signals. The first code signal is respectively received by N phase selector units, and each of the N phase selector units is configured to convert the two first clock signals into two output clock signals according to the first code signal and output the same to the two output ends of the phase selector circuit, and the output clock signals have the same frequencies and the same phases as the first clock signal.

The current source circuit is connected in series to the two output ends of the phase selector circuit, the current source circuit serves as a load of the phase selector circuit.

The comparison circuit is connected to the two output ends of the phase selector circuit and the N first tail current tubes, and is configured to compare a common-mode voltage of the two output clock signals with a reference voltage and perform negative feedback regulation on a magnitude of the first bias voltage.

The phase interpolator circuit is connected to the controller and the two phase selector circuits respectively, and is configured to receive the two first clock signals output from the two phase selector circuits, and output a second clock signal after performing a weighted operation on the two first clock signals received according to a second code signal output by the controller.

In accordance with a second aspect of the embodiments of the present application, a clock data recovery circuit is provided which includes the phase selector/phase interpolator circuit as described above.

In accordance with a third aspect of the embodiments of the present application, an electronic device is provided which includes the clock data recovery circuit as described above.

Compared with the prior art, the embodiments of the present application have the following beneficial effects: the above-mentioned phase selector/phase interpolator circuit includes two phase selector circuits and one phase interpolator circuit. Each phase selector circuit includes N first tail current tubes, N phase selector units, a current source circuit and a comparison circuit. The current source circuit is selected as a load of the phase selector circuit. The comparison circuit compares a common-mode voltage of the two output clock signals output from the phase selector unit with a reference voltage, and performs negative feedback regulation on the first bias voltage of the first tail current tubes so that the common-mode voltage can be controlled to be equal to the reference voltage, which ensures the stability of the common-mode point of the output signal, thereby the tail current of the first tail current tube is controlled to be equal to the current of the current source circuit, and the output waveform becomes a linear triangular wave, which thus can realize linear interpolation, ensure the output phase accuracy, and reduce the phase jitter of the clock signal.

BRIEF DESCRIPTION OF THE DRAWINGS

To illustrate the technical solutions in the embodiments of the present application more clearly, the drawings required for use in the descriptions of the embodiments will be briefly introduced below. Obviously, the drawings described below are only some embodiments of the present application. For ordinary technicians in this field, other drawings may also be obtained based on these drawings without exerting creative efforts.

DETAILED DESCRIPTION OF THE EMBODIMENTS

To clarify the technical problems to be solved, technical solutions and beneficial effects of the present application, the present application is further described in detail below in conjunction with the accompanying drawings and embodiments. It should be understood that the specific embodiments described herein are merely used to explain the present application and are not intended to limit the present application.

In addition, the terms "first" and "second" are only used for descriptive purposes and cannot be understood as indicating or implying relative importance or implicitly indicating the number of technical features indicated. Thus, the features defined as "first" and "second" may explicitly or implicitly include one or more of the features. In the description of the present application, the term "multiple" means two or more, unless otherwise clearly and specifically defined.

In a first aspect of the embodiments of the present application, a phase selector/phase interpolator circuit 100 of a clock data recovery circuit is provided, and the clock data recovery circuit also includes a controller. The controller is configured to output a code signal to a corresponding module in the phase selector/phase interpolator circuit 100 for selective interpolation output of the clock signals input by the phase selector/phase interpolator circuit 100.

Figure 1:
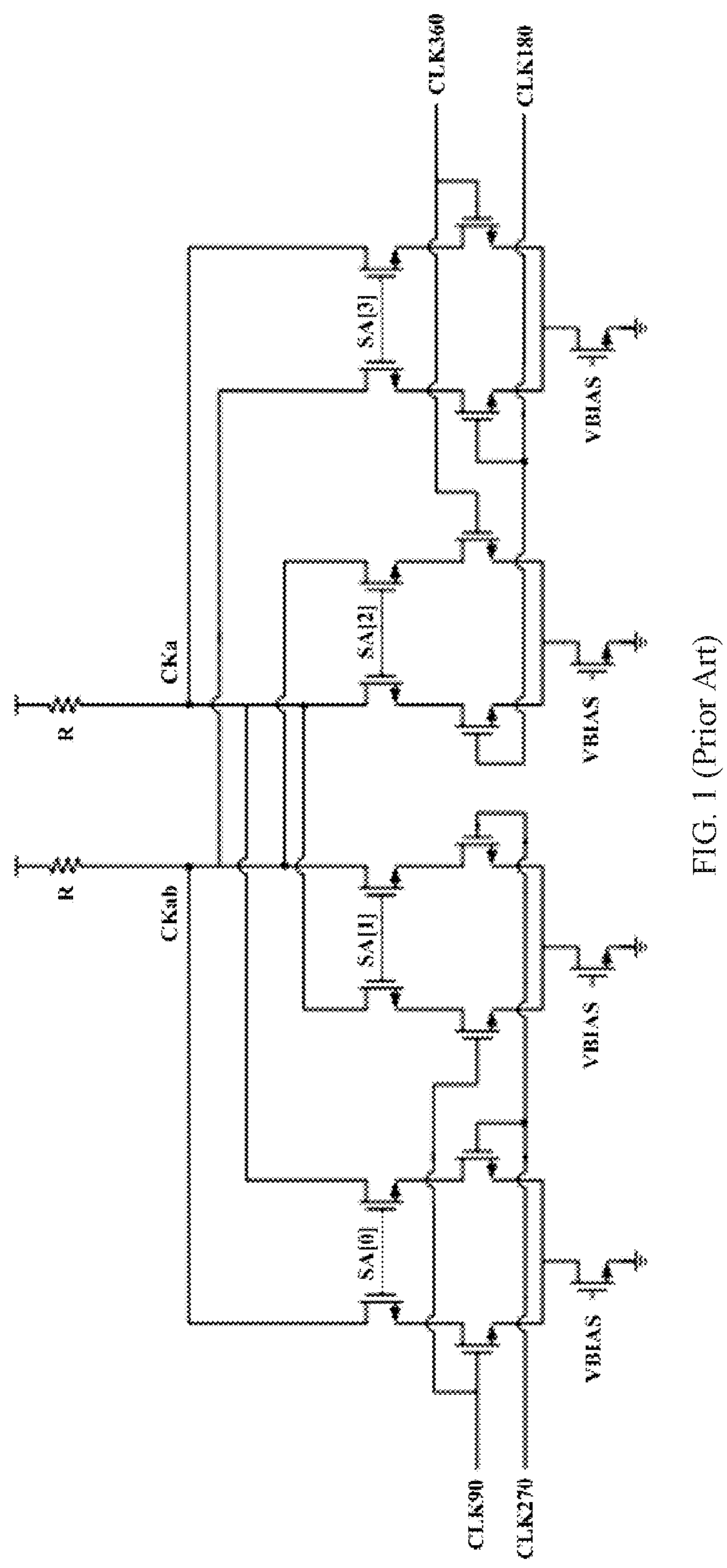
FIG. 1 is a circuit diagram of a conventional phase selector circuit.
Figure 2:
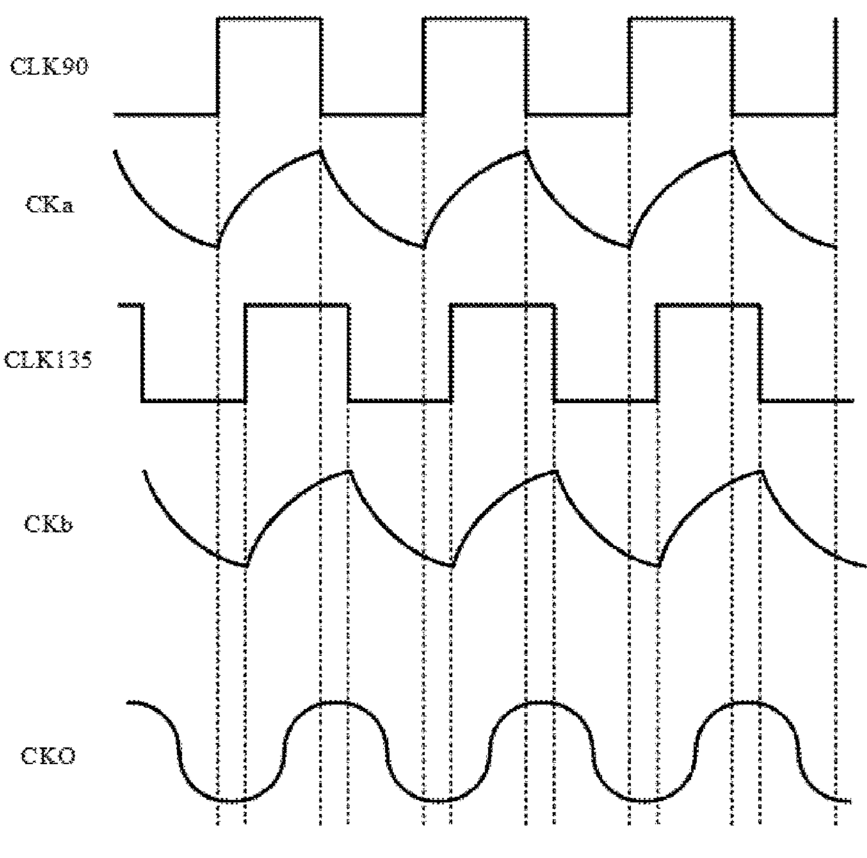
FIG. 2 is a waveform diagram of each signal of a conventional phase selector/phase interpolator circuit.
Figure 3:
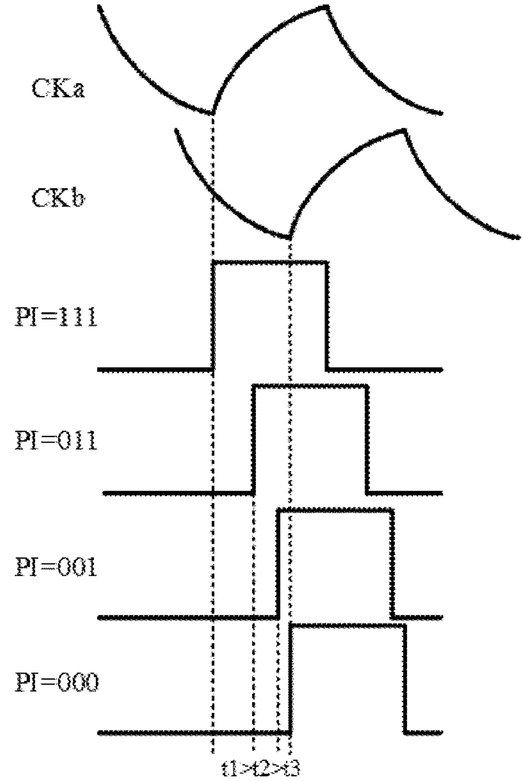
FIG. 3 is a waveform diagram of a conventional phase interpolator circuit during phase interpolation.
Figure 4:
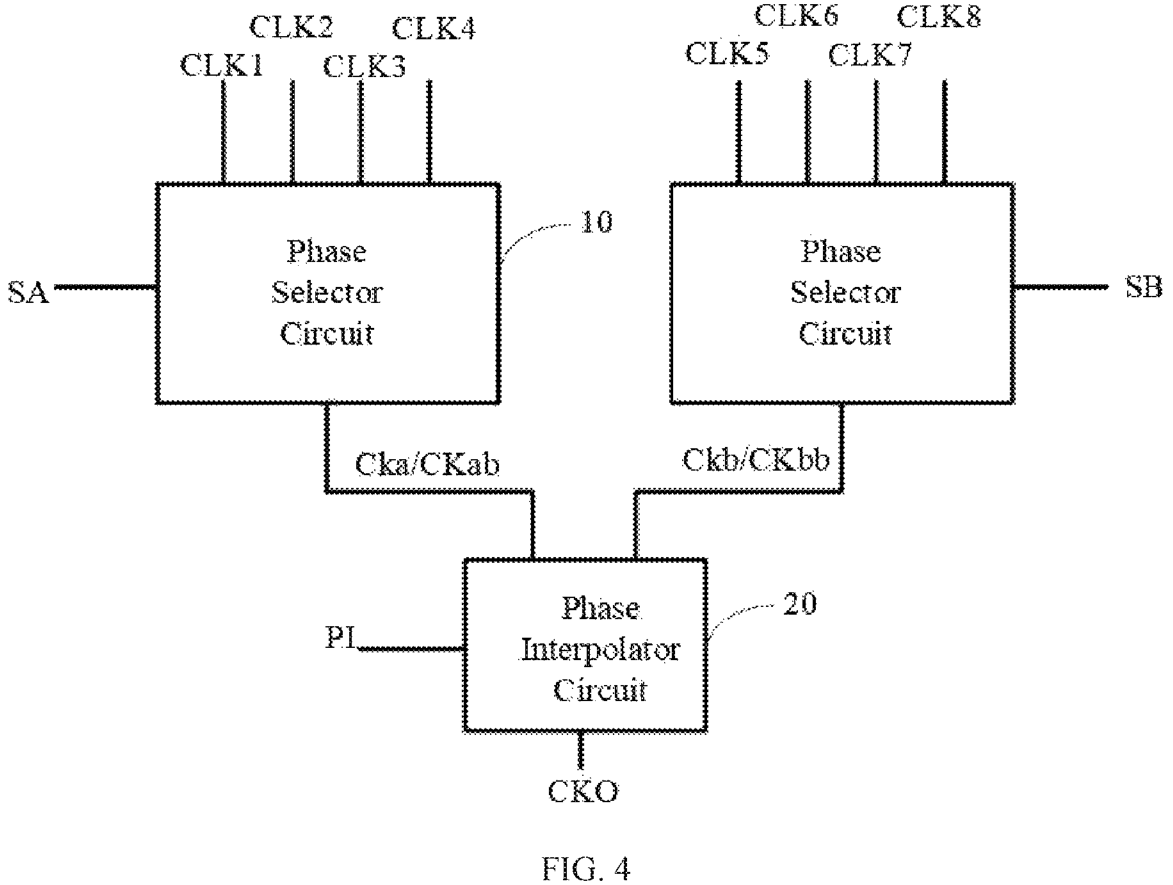
FIG. 4 is a structural diagram of a phase selector/phase interpolator circuit provided in an embodiment of the present application.

As shown in FIG. 4, the phase selector/phase interpolator circuit 100 includes two phase selector circuits 10 and one phase interpolator circuit 20. The two phase selector circuits 10 are respectively connected to the controller of the clock data recovery circuit. Each phase selector circuit 10 is configured to select and output one of N first clock signals of different phases received according to a first code signal SA or SB output by the controller, where $N \geq 2$.

The phase interpolator circuit 20 is respectively connected to the controller and the two phase selector circuits 10, and is configured to receive the two first clock signals output from the two phase selector circuits 10, and output a second clock signal CKO after weighted operation on the two received first clock signals according to a second code signal PI output by the controller.

In this embodiment, the phases of the first clock signals received by each phase selector circuit 10 are different. Each phase selector circuit 10 receives N first clock signals having different phase with respect to the reference clock. For example, one of the two phase selector circuits 10 receives four first clock signals having phase differences of 90°, 180°, 270° and 360° with respect to the reference clock, respectively, and the other one of the two phase selector circuits 10 receives four first clock signals having phase differences of 45°, 135°, 225°, and 315° with respect to the reference clock, respectively. The phases of the first clock signals may be set based on actual demands, and the phase differences with respect to the reference clock may be set in an arithmetic progression or in other setting modes, and the specific values and variation rules are not limited in here.

In an optional embodiment, one of the two phase selector circuits 10 receives N first clock signals, and the N first clock signals respectively have a phase difference of $k1*(360°/2N)$ with respect to the reference clock, and k1 is 1, 3 . . . 2N−1.

The other one of the two phase selector circuits 10 receives N first clock signals, and the N first clock signals respectively have a phase difference of $k2*(360°/2N)$ with respect to the reference clock, and k2 is 2, 4 . . . 2N.

In this embodiment, the phase difference between each first clock signal and the reference clock is set in an arithmetic progression. In case that N is equal to 4, then one of the two phase selector circuits 10 receives four first clock signals whose phase differences with respect to the reference clock are 90°, 180°, 270° and 360°, respectively, and the other one of the two phase selector circuits 10 receives four first clock signals whose phase differences with respect to the reference clock are 45°, 135°, 225° and 315°, respectively.

In case that N is equal to 6, then one of the two phase selector circuits 10 receives six first clock signals whose phase differences with respect to the reference clock are 30°, 90°, 150°, 210°, 270° and 330°, respectively, and the other one of the two phase selector circuits 10 receives six first clock signals whose phase differences with respect to the reference clock are 60°, 120°, 180°, 240°, 300° and 360°, respectively.

The numerical N may be set according to the requirements. In an optional embodiment, to simplify the circuit structure and logical operation, N is equal to 4.

The first code signal SA or SB received by each phase selector circuit 10 may be the same or different. Each phase selector circuit 10 selects one of the input first clock signals according to the received first code signal SA or SB and outputs the same. For example, when the first code signal SA received by a first phase selector circuit 10 is 0001, the 1-st first clock signal CLK1 is selected to be output, and when the first code signal SA is 0010, the 2-nd first clock signal CLK2 is selected to be output, and accordingly, the corresponding first clock signal from the 1-st first clock signal CLK1 to the 4-th first clock signal CLK4 is selected to be output.

When the first code signal SA received by a second phase selector circuit 10 is 0001, the fifth first clock signal CLK5 is selected to be output, and when the first code signal SA is 0010, the sixth first clock signal CLK6 is selected to be output, and accordingly, the corresponding first clock signal from the 5-th first clock signal to the 8-th first clock signal is selected to be output.

The first clock signals selected to be output by each phase selector circuit 10 have different phases. For example, the two phase selector circuits 10 respectively select and output two first clock signals having phase differences of 90° and 45° with respect to the reference clock.

The phase interpolator circuit 20 is configured to linearly interpolate the two first clock signals according to the received second code signal PI, thereby a second clock signal CKO having a phase between the two inputs is output. For example, after weighted operation, a phase difference between the output second clock signal CKO and the reference clock is 60°.

Figure 5:
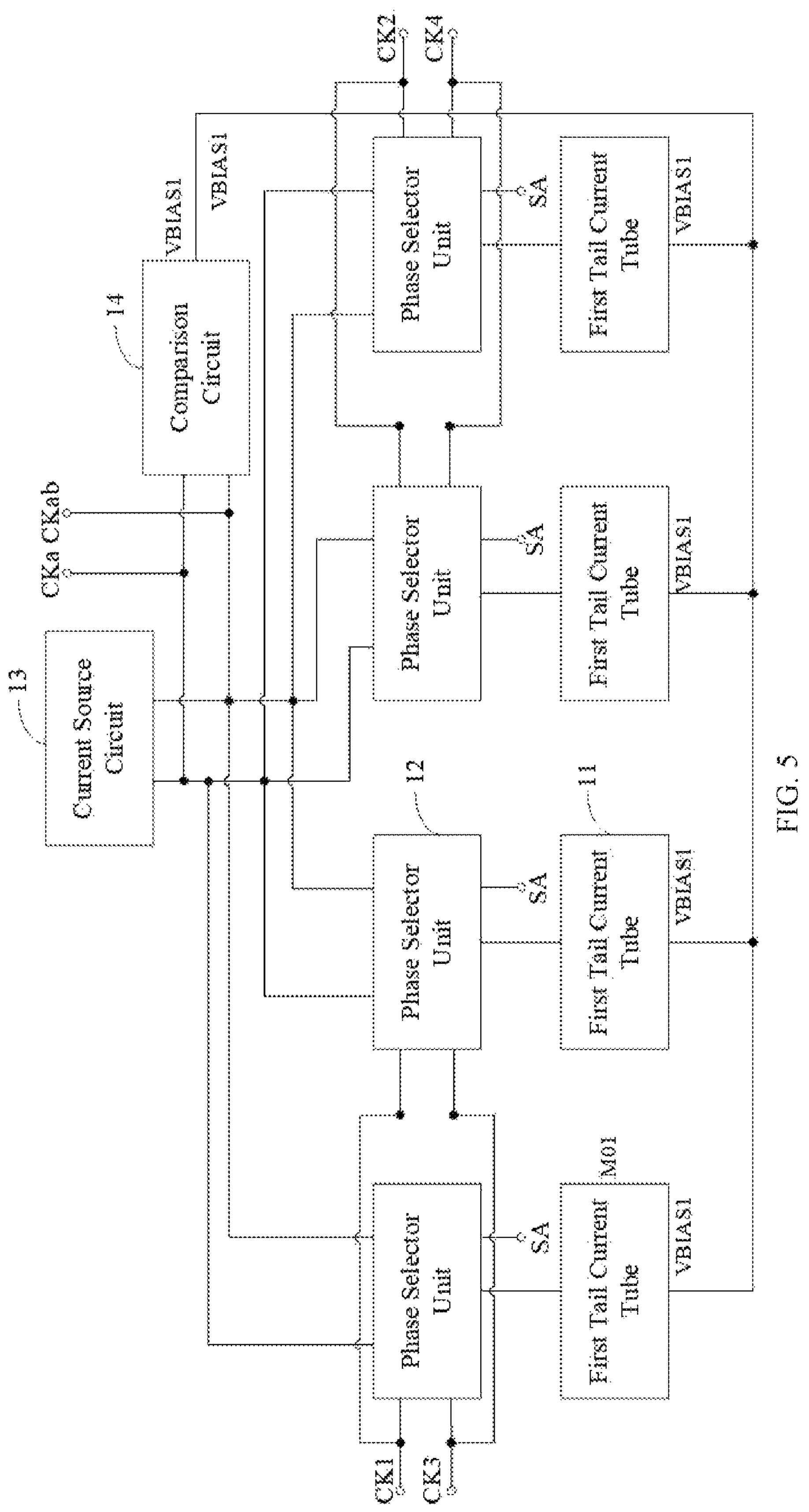
FIG. 5 is a structural diagram of a first phase selector circuit provided in an embodiment of the present application.
Figure 6:
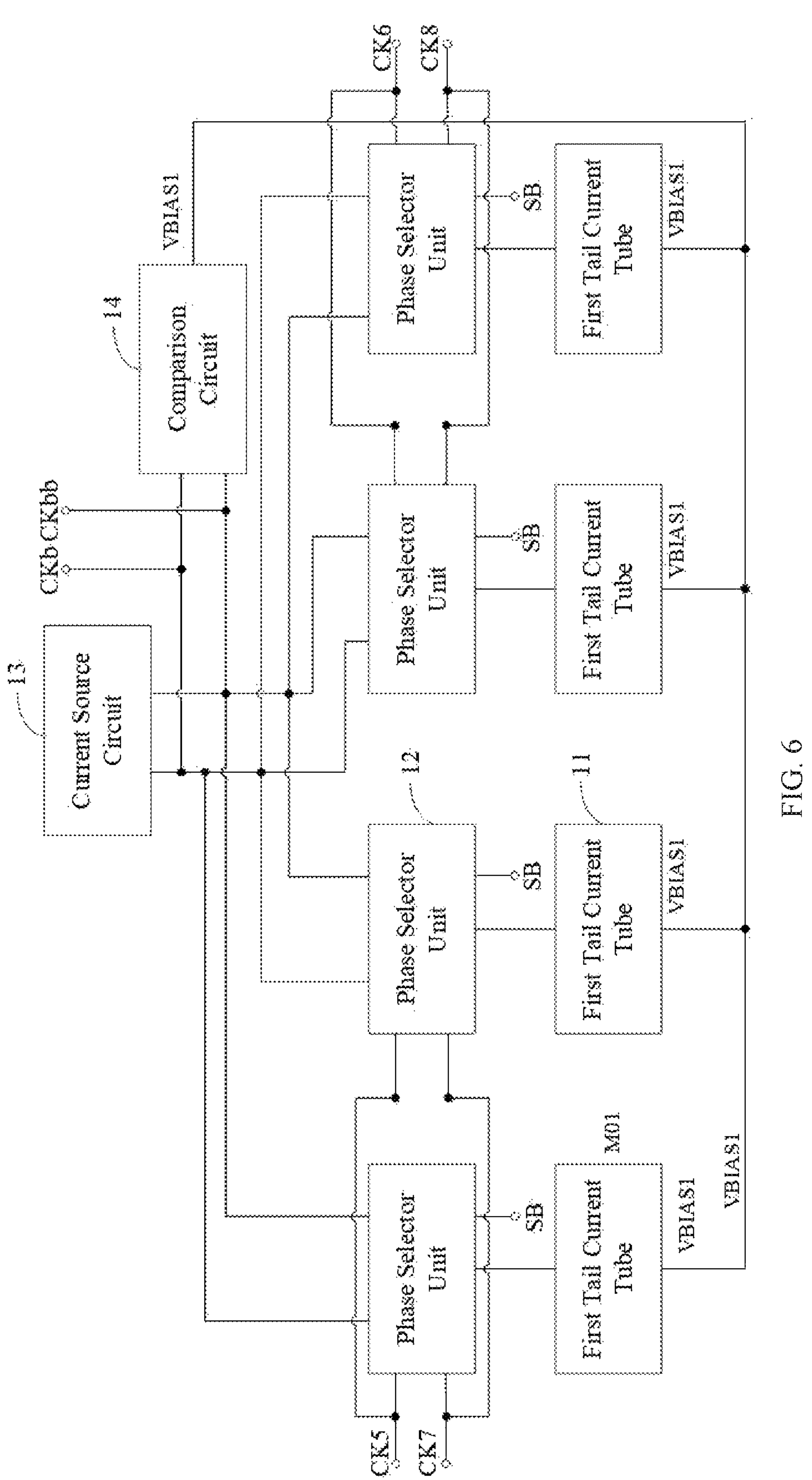
FIG. 6 is a structural diagram of a second phase selector circuit provided in an embodiment of the present application.

As shown in FIG. 5 and FIG. 6, in this embodiment, each phase selector circuit 10 includes: N first tail current tubes M01, N phase selector units 12, a current source circuit 13 and a comparison circuit 14.

The N first tail current tubes M01 are respectively configured to output a tail current of corresponding magnitude according to a first bias voltage VBIAS1, and the tail current is positively correlated with the first bias voltage VBIAS1.

Each of the N phase selector units 12 is connected to one first tail current tube M01 and two output ends of the phase selector circuit 10, and every two phase selector units 12 receive the same two first clock signals, and the N phase selector units 12 receive the first code signal SA, and each phase selector unit 12 is configured to convert the two first clock signals into two output clock signals according to the first code signal SA and output the same to the two output ends of the phase selector circuit 10. The output clock signals have the same frequency and phase as the first clock signals.

The current source circuit 13 is connected in series to the two output ends of the phase selector circuit 10. The current source circuit 13 serves as a load of the phase selector circuit 10.

The comparison circuit 14 is connected to the two output ends of the phase selector circuit 10 and the N first tail current tubes M01. The comparison circuit 14 is configured to compare a common-mode voltage of the two output clock signals with the reference voltage Vcm, and perform negative feedback regulation on the magnitude of the first bias voltage VBIAS1.

In this embodiment, when N=4, the phase selector circuit 10 includes four first tail current tubes 11 and four phase selector units 12, and every two phase selector units 12 form a unit group and receive two first clock signals of different phases. For example, as shown in FIG. 5, the first phase selector unit 12 and the second phase selector unit 12 receive the 1-st first clock signal CLK1 and the 3-rd first clock signal CLK3. The third phase selector unit 12 and the fourth phase selector unit 12 receive the 2-nd first clock signal CLK2 and the 4-th first clock signal CLK4. The two phase selector units 12 in the unit group are respectively selected to be switched on according to the received first code signal SA, and one of the first clock signals is selected to be output. For example, when the first code signal SA received by the first phase selector unit 12 and the second phase selector unit 12 is 0001, the first phase selector unit 12 is correspondingly switched on and the 1-st first clock signal CLK1 and the 2-nd first clock signal CLK2 are selected to be output in a time-sharing manner, and when the first code signal SA received by the first phase selector unit 12 and the second phase selector unit 12 is 0010, the second phase selector unit 12 is correspondingly switched on and the 1-st first clock signal CLK1 and the 2-nd first clock signal CLK2 are selected to be output in a time-sharing manner, to form an output clock signal.

The first tail current tube 11 outputs a positively correlated tail current according to the magnitude of the received first bias voltage VBIAS1. The tail current is output to the current source circuit 13 through the phase selector unit 12 when the phase selector unit 12 is switched on. The current source circuit 13 serves as the load of the phase selector circuit 10. The first tail current tube 11 charges the load. Under the triggering of different first clock signals and different first code signals SA, the on-time and off-time of the phase selector unit 12 change accordingly, thereby two output clock signals having the same frequency and phase as the two first clock signals are output. The output clock signals have current characteristics and are converted into common-mode voltages through the current source circuit 13.

Figure 10:
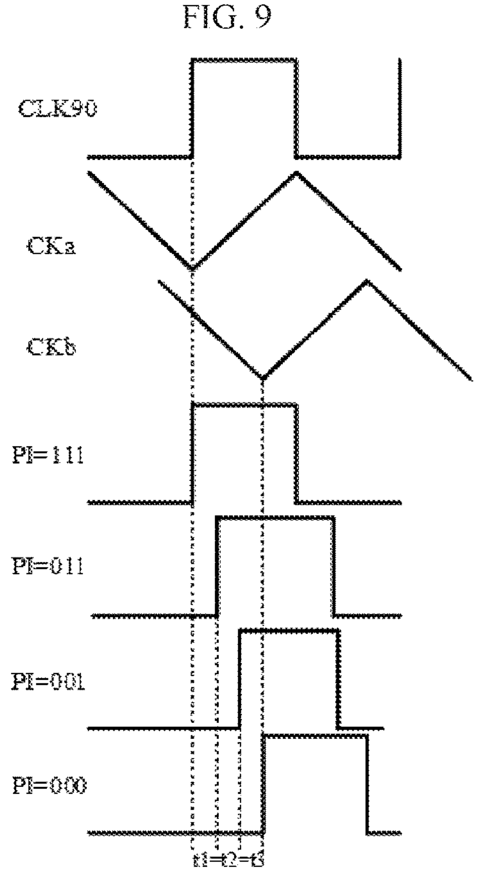
FIG. 10 is a waveform diagram of the phase interpolator circuit provided in an embodiment of the present application during phase interpolation.

The two common-mode voltages change in a positive correlation with the magnitude of the output clock signals. The comparison circuit 14 compares the common-mode voltage of the two output clock signals output from the phase selector unit 12 with the reference voltage Vcm, and performs negative feedback regulation on the first bias voltage VBIAS1 of the first tail current tube 11. For example, the first bias voltage VBIAS1 output from the comparison circuit 14 becomes larger and the tail current increases as the terminal voltage of the current source circuit 13, i.e., the common-mode voltage, becomes larger in case that the current of the two output clock signals is greater than the tail current. Or alternatively, the first bias voltage VBIAS1 output from the comparison circuit 14 becomes smaller and the tail current decreases as the terminal voltage of the current source circuit 13, i.e., the common-mode voltage, becomes smaller in case that the current of the two output clock signals is smaller than the tail current, and finally, the current value of the two output clock signals is controlled to be equal to the tail current, and the common-mode voltage is controlled to be equal to the reference voltage Vcm, so that the stability of the common-mode point of the output signal can be ensured. As shown in FIG. 10, the output waveform of the phase selector unit 12 becomes a linear triangle wave, and the phase interpolator circuit 20 can realize linear interpolation under the triggering of different second code signals PI, which thus can ensure the output phase accuracy and reduce the phase jitter of the clock signal.

The phases of the two first clock signals received by the two phase selector units 12 of the unit group may be selected according to the requirements. In an optional embodiment, the two output clock signals of the two phase selector units 12 are clock signals having opposite electric levels. Correspondingly, the two phase selector units 12 in each phase selector circuit 10 receive the two first clock signals, and the phase difference between the two first clock signals is 180°;

The other two phase selector units 12 in each phase selector circuit 10 receive the other two first clock signals, and the phase difference between the two first clock signals is 180°.

For example, the 1-st first clock signal and the 3-rd first clock signal received by the two phase selector units 12 in the unit group have a phase difference of 90° and 270° with respect to the reference clock, respectively. The 2-nd first clock signal and the 4-th first clock signal received by the two phase selector units 12 in the other unit group have a phase difference of 180° and 360° with respect to the reference clock, respectively. The two output clock signals output from phase selector unit 12 have opposite phases.

The phase selector unit 12 and the phase interpolator circuit 20 may have corresponding transistor structures, the current source circuit 13 may include corresponding transistors and current sources, the comparison circuit 14 may have corresponding comparator U1 structures, and the first tail current tube 11 may be N-channel transistors according to the relationship between voltage and current.

Figure 7:
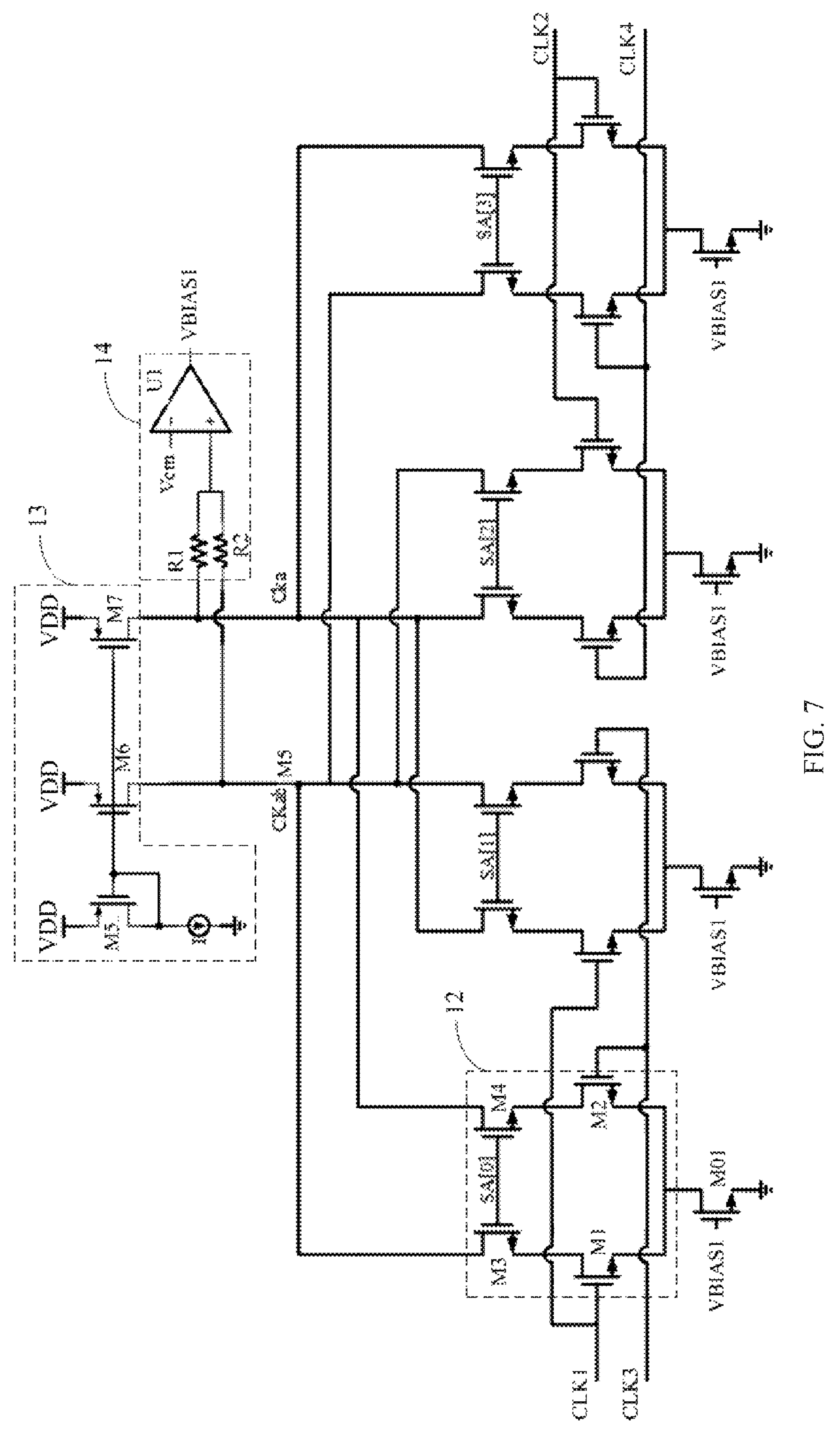
FIG. 7 is a circuit diagram of the first phase selector circuit provided in an embodiment of the present application.
Figure 8:
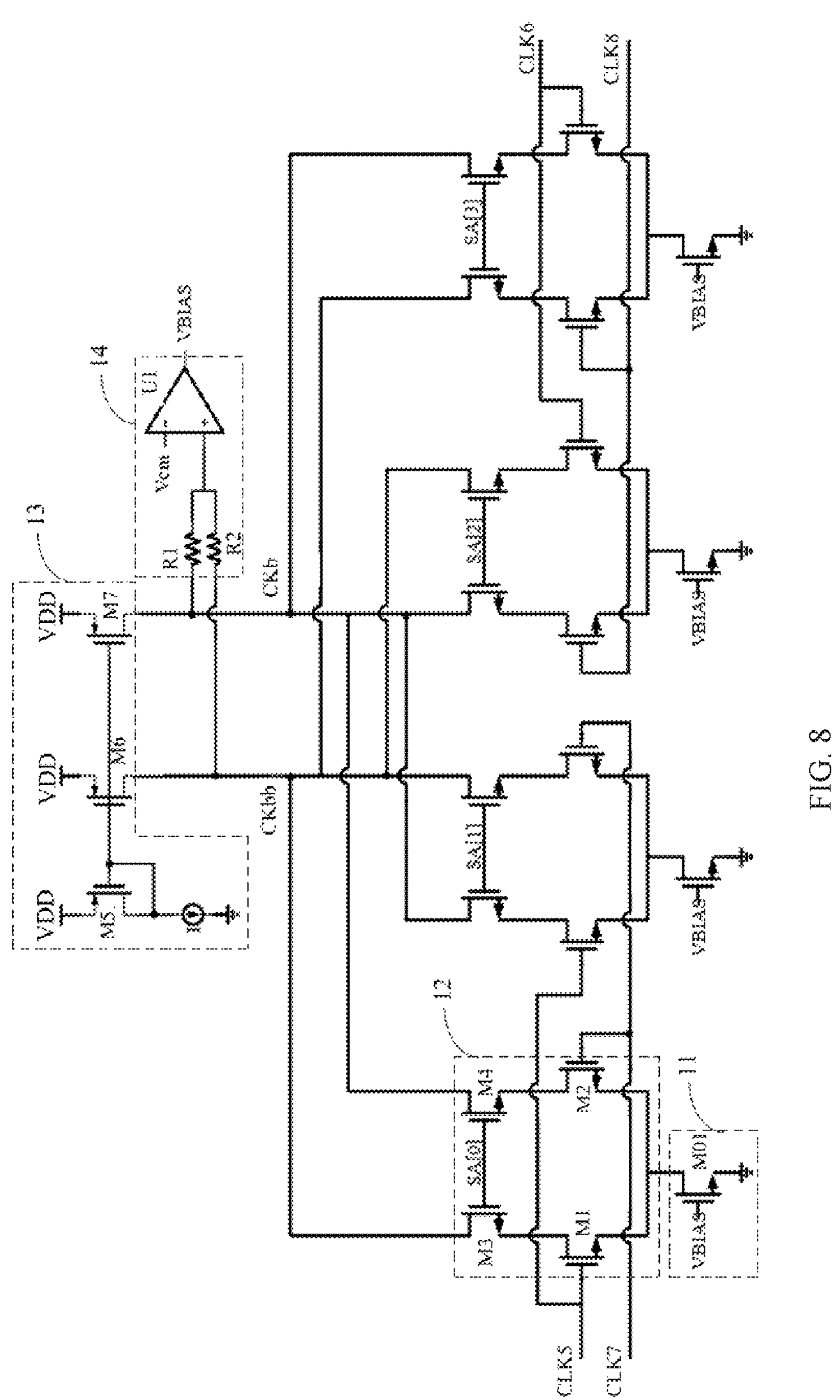
FIG. 8 is a circuit diagram of the second phase selector circuit provided in an embodiment of the present application.
Figure 9:
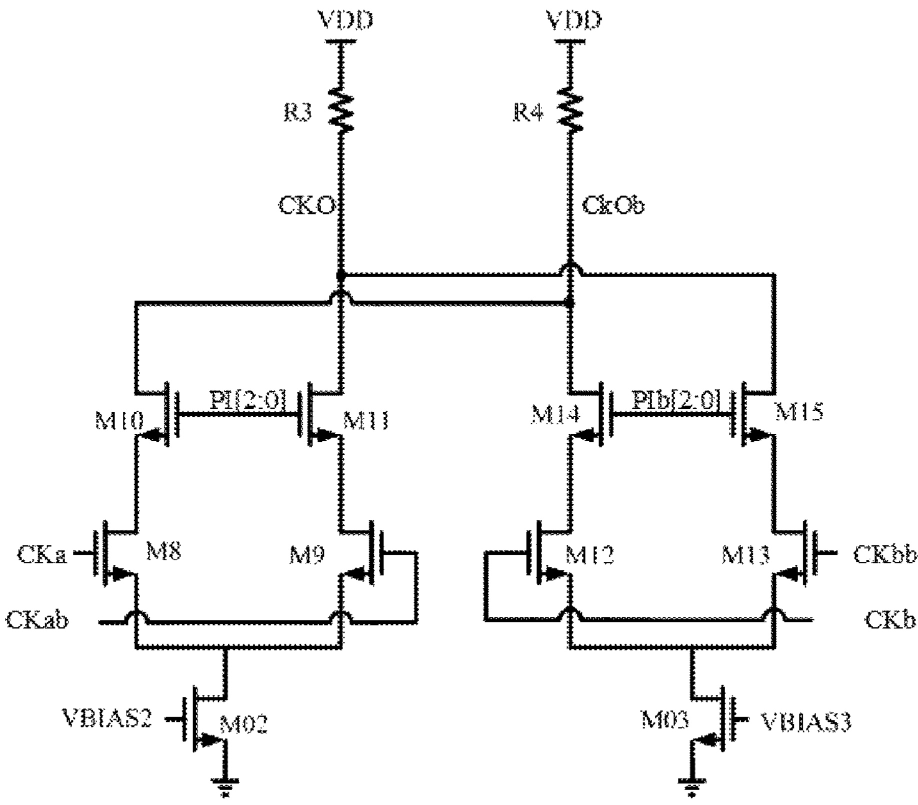
FIG. 9 is a circuit diagram of a phase interpolator circuit provided in an embodiment of the present application.

In an optional embodiment, as shown in FIG. 7 to FIG. 9, the phase selector unit 12 includes a first transistor M1, a second transistor M2, a third transistor M3, and a fourth transistor M4.

A first end of the first transistor M1 and a first end of the second transistor M2 are connected in common to a first end of a first tail current tube M01. A second end of the first transistor M1 is connected to a first end of the third transistor M3, and a second end of the second transistor M2 is connected to a first end of the fourth transistor M4. A control end of the first transistor M1 and a control end of the second transistor M2 are respectively configured to receive a first clock signal, and a phase difference of the first clock signal received by the first transistor M1 and the first clock signal received by the second transistor M2 is 180°.

A second end of the third transistor M3 and a second end of the fourth transistor M4 are respectively connected to the current source circuit 13, and the second end of the third transistor M3 is also connected to the second end of the fourth transistor M4 of another phase selector unit 12 receiving the same two first clock signals, and the second end of the fourth transistor M4 is connected to the second end of the third transistor M3 of the other phase selector unit 12 receiving the same two first clock signals.

The current source circuit 13 includes a fifth transistor M5, a sixth transistor M6, a seventh transistor M7 and a current source I.

A first end of the fifth transistor M5, a first end of the sixth transistor M6 and a first end of the seventh transistor M7 are respectively connected to a positive power supply terminal VDD. A control end of the fifth transistor M5, a second end of the fifth transistor M5, a control end of the sixth transistor M6 and a control end of the seventh transistor M7 are connected to the current source I. A second end of the sixth transistor M6 and a second end of the seventh transistor M7 are respectively connected to the two output ends of the phase selector circuit 10.

The comparison circuit 14 includes a first resistor R1, a second resistor R2 and a comparator U1.

A first end of the first resistor R1 and a first end of the second resistor R2 are respectively connected to the second end of the seventh transistor M7 and the second end of the sixth transistor M6. A second end of the first resistor R1 and a second end of the second resistor R2 are connected to a non-inverting input end of the comparator U1. An inverting input end of the comparator U1 is configured for receiving the reference voltage Vem, and an output end of the comparator U1 is connected to the control end of each first tail current tube M01.

The phase interpolator circuit 20 includes an eighth transistor M8, a ninth transistor M9, a tenth transistor M10, an eleventh transistor M11, a twelfth transistor M12, a thirteenth transistor M13, a fourteenth transistor M14, a fifteenth transistor M15, a second tail current tube M02, a third tail current tube M03, a third resistor R3 and a fourth resistor R4.

A first end of the eighth transistor M8 and a first end of the ninth transistor M9 are connected to a first end of the second tail current tube M02. A control end of the second tail current tube M02 is configured to receive a second bias voltage VBIAS2, and a second end of the second tail current tube M02 is grounded. A control end of the eighth transistor M8 and a control end of the ninth transistor M9 are respectively connected to the two output ends of one of the two phase selector circuits 10. A second end of the eighth transistor M8 is connected to a first end of the tenth transistor M10, and a second end of the ninth transistor M9 is connected to a first end of the eleventh transistor M11. A control end of the tenth transistor M10 and a control end of the eleventh transistor M11 are configured to receive the second code signal PI. A second end of the tenth transistor M10 and a second end of the fourteenth transistor M14 are connected to a first end of the fourth resistor R4. A second end of the eleventh transistor M11 and a second end of the fifteenth transistor M15 are connected to the first end of the third resistor R3. A second end of the third resistor R3 and a second end of the fourth resistor R4 are connected to the positive power supply terminal VDD.

A first end of the twelfth transistor M12 and a first end of the thirteenth transistor M13 are connected to a first end of the third tail current tube M03. A control end of the third tail current tube M03 is configured to receive a third bias voltage VBIAS3, and a second end of the third tail current tube M03 is grounded. A control end of the twelfth transistor M12 and a control end of the thirteenth transistor M13 are respectively connected to the two output ends of the other one of the two phase selector circuits 10. A second end of the twelfth transistor M12 is connected to a first end of the fourteenth transistor M14, and a second end of the thirteenth transistor M13 is connected to a first end of the fifteenth transistor M15.

Taking the first phase selector circuit 10 as an example, the first phase selector circuit 10 receives the 1-st first clock signal CLK1 to the 4-th first clock signal CLK4, assuming that the 1-st first clock signal and the 3-rd first clock signal respectively have a phase difference of 90° and 270° with respect to the reference clock, and the 2-nd first clock signal and the 4-th first clock signal respectively have a phase difference of 180° and 360° with respect to the reference clock.

The third transistor M3 and the fourth transistor M4 of each phase selector unit 12 form a switch pair, and these switch pairs are switched on respectively under the control of the first code signal SA. For example, as shown in FIG. 7, when the first code signal SA is 0001, the leftmost switch pair is switched on, when the first code signal SA is 0010, the second switch pair from the left is switched on, and when the first code signal SA is 1000, the rightmost switch pair is switched on.

The fifth transistor M5 and the sixth transistor M6 form a current source bias circuit, the fifth transistor M5 and the seventh transistor M7 form a current source bias circuit, and the sixth transistor M6 and the seventh transistor M7 form a current source.

After the third transistor M3 and the fourth transistor M4 of one of the phase selector units 12 are switched on, the first transistor M1 and the second transistor M2 are switched on alternately according to the two received first clock signals, and the first tail current tube 11 outputs a current signal via the first transistor M1 and the second transistor M2, that is, two output clock signals with opposite phases are formed, and the output clock signals are output to the sixth transistor M6 and the seventh transistor M7 of the current source circuit 13. Since the load becomes a current source, the output waveform of the phase selector circuit 10 becomes a linear triangular wave, and the output clock signal forms a common-mode voltage on the load side. The common-mode voltage is output to the comparator U1 via the first resistor R1 and the second resistor R2. The comparator U1 compares the common-mode voltage with the reference voltage Vcm, and performs negative feedback regulation on the tail current of the first tail current tube 11, so that a sum of the current of the fifth transistor M5 and the current of the sixth transistor M6 is equal to the tail current.

For example, the first bias voltage VBIAS1 output from the comparison circuit 14 becomes larger and the tail current increases as the terminal voltage of the current source circuit 13, i.e., the common-mode voltage, becomes larger in case that the current value of the two output clock signals is greater than the tail current. Or alternatively, the first bias voltage VBIAS1 output from the comparison circuit 14 becomes smaller and the tail current decreases as the terminal voltage of the current source circuit 13, i.e., the common-mode voltage, becomes smaller in case that the current value of the two output clock signals is smaller than the tail current, so that the current of the two output clock signals is controlled to be equal to the tail current, and the common-mode voltage is controlled to be equal to the reference voltage Vcm, so that the stability of the common-mode point of the output signal is ensured. As shown in FIG. 10, the output waveform of the phase selector unit 12 becomes a linear triangle wave.

The tenth transistor M10 and the eleventh transistor M11 of the phase interpolator circuit 20 form a switch pair, and the fourteenth transistor M14 and the fifteenth transistor M15 form a switch pair. Under the triggering of different second code signals PI, the tenth transistor M10 and the eleventh transistor M11 are switched on, or the fourteenth transistor M14 and the fifteenth transistor M15 are switched on. The eighth transistor M8 and the ninth transistor M9 are switched on under the triggering of the two first clock signals output from one of the two phase selector circuits 10. The twelfth transistor M12 and the thirteenth transistor M13 are switched on under the triggering of the two first clock signals output from the other one of the two phase selector circuits 10, so that the two second clock signals CKO with opposite phases realize linear interpolation, which ensures the output phase accuracy, and reduces the phase jitter of the clock signal.

Compared with the prior art, the embodiment of the present application has the following beneficial effects: the above-mentioned phase selector/phase interpolator circuit 100 includes two phase selector circuits 10 and one phase interpolator circuit 20, each of the two phase selector circuits 10 includes N first tail current tubes M01, N phase selector units 12, a current source circuit 13 and a comparison circuit 14. The current source circuit 13 is selected as a load of the phase selector circuit 10, the comparison circuit 14 compares the common-mode voltage of the two output clock signals output from the phase selector unit 12 with the reference voltage Vcm, and performs negative feedback regulation on the first bias voltage VBIAS1 of the first tail current tube 11, so that the common-mode voltage can be controlled to be equal to the reference voltage Vcm, which ensures the stability of the common-mode point of the output signal, thereby the tail current of the first tail current tube 11 is controlled to equal to the current of the current source circuit 13, and the output waveform becomes a linear triangular wave, which thus can realize the linear interpolation, ensure the output phase accuracy, and reduce the phase jitter of the clock signal.

In a second aspect of the embodiments of the present application, a clock data recovery circuit is provided, which includes a phase selector/phase interpolator circuit 100. For the specific structure of the phase selector/phase interpolator circuit 100, references should be made to the above-mentioned embodiments. Since the clock data recovery circuit adopts all the technical solutions of the above embodiments, the clock data recovery circuit at least has all the beneficial effects brought by the technical solutions of the above embodiments, which will not be repeated here.

Figure 11:
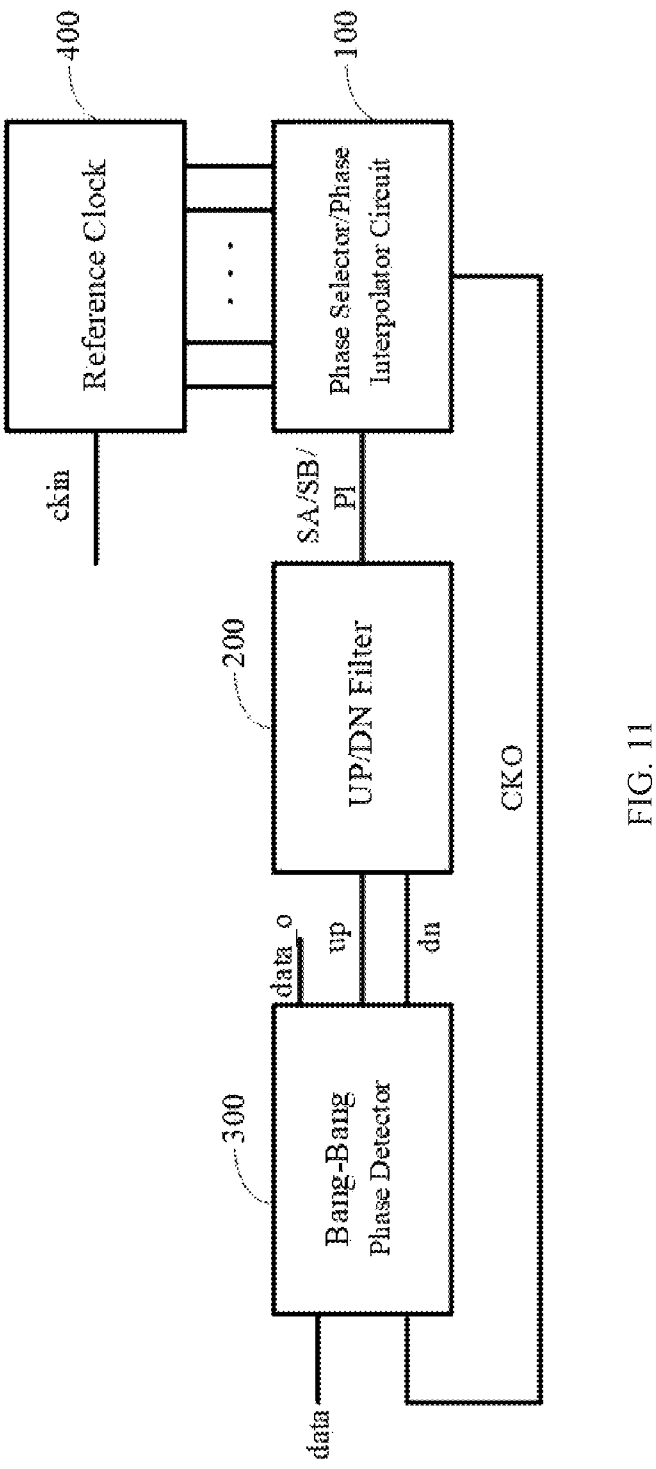
FIG. 11 is a structural diagram of a clock data recovery circuit provided in an embodiment of the present application.

As shown in FIG. 11, the clock data recovery circuit also includes a Bang-Bang phase detector (BBPD), a UP/DN filter, a phase selector/phase interpolator circuit 100, a controller and a reference clock. The reference clock provides four clock signals into the two phase selector circuits 10. The two phase selector circuits 10 generate two output clock signals according to the first code signal SA of the controller. The phase interpolator circuit 20 performs phase interpolation operation on the two output clock signals according to the second code signal PI to generate the second clock signal CKO. The Bang-Bang type phase detector compares the phases of the data signal data and the second clock signal CKO and generates the corresponding leading up signal and lagging dn signal. The UP/DN filter generates UPF and DNF after filtering the up signal and dn signal. The controller receives the UPF and DNF signals and generates the code signal for controlling the two phase selectors (PS) and the phase interpolator (PI) according to the second clock signal CKO. The clock data recovery circuit forms a phase-locked loop until the phase alignment of the second clock signal CKO and the data signal data reaches a locking of the loop. At this time, the second clock signal CKO is the clock signal recovered from the data. The data signal data is further judged and re-timed to obtain the recovered data signal, namely Re_data.

In a third aspect of the embodiments of the present application, an electronic device is also provided, which includes a clock data recovery circuit. For the specific structure of the clock data recovery circuit, references should be made to the above-mentioned embodiment. Since the electronic device adopts all the technical solutions of all the above-mentioned embodiments, the electronic device at least has all the beneficial effects brought by the technical solutions of the above-mentioned embodiments, which will not be described again here.

In this embodiment, the electronic device may be an electronic device having a clock data recovery circuit, such as a serializer, an image sensor, and the like.

The above embodiments are only used to illustrate the technical solution of the present application, and are not intended to limit the present application. Although the present application is described in detail with reference to the above embodiments, a person skilled in the art should understand that the technical solution described in the above embodiments may still be modified, or some of the technical features thereof may be replaced by equivalents. These modifications or replacements do not deviate the essence of the corresponding technical solution from the spirit and scope of the technical solution of each embodiment of the present application, which thus should all be included within the protection scope of the present application.

What is claimed is:

1. A phase selector/phase interpolator circuit of a clock data recovery circuit, comprising:

two phase selector circuits, respectively connected to a controller of the clock data recovery circuit, each of the two phase selector circuits configured to select and output one of N first clock signals of different phases received according to a first code signal output by the controller, wherein N≥2, and wherein each of the two phase selector circuits comprises:

N first tail current tubes which are respectively configured to output a tail current of corresponding magnitude according to a first bias voltage, wherein the tail current changes in a positive correlation with the first bias voltage;

N phase selector units, wherein each of the N phase selector units is connected to one of the N first tail current tubes and two output ends of the phase selector circuit, each two of the phase selector units receive two first clock signals, and the first code signal is respectively received by the N phase selector units, and each of the N phase selector units is configured to convert the two first clock signals into two output clock signals according to the first code signal and output the two output clock signals to the two output ends of the phase selector circuit, wherein the two output clock signals have same frequencies and phases as the two first clock signals;

a current source circuit which is connected in series to the two output ends of the phase selector circuit, and the current source circuit serves as a load of the phase selector circuit; and a comparison circuit which is connected to the two output ends of the phase selector circuit and the N first tail current tubes, and configured to compare a common-mode voltage of the two output clock signals with a reference voltage and perform negative feedback regulation on a magnitude of the first bias voltage; and a phase interpolator circuit, respectively connected to the controller and the two phase selector circuits, configured to receive the two first clock signals output from the two phase selector circuits and output a second clock signal after performing a weighted operation on the two first clock signals received according to a second code signal output by the controller.

2. The phase selector/phase interpolator circuit of the clock data recovery circuit as claimed in claim 1, wherein one of the two phase selector circuits receives N first clock signals, and the N first clock signals are respectively phase-differentiated with the reference clock by k1*(360°/2N), wherein k1 is 1, 3 . . . 2N−1; and another one of the two phase selector circuits receives N first clock signals, and the N first clock signals are respectively phase-differentiated with the reference clock by k2*(360°/2N), wherein k2 is 2, 4 . . . 2N.

3. The phase selector/phase interpolator circuit of the clock data recovery circuit as claimed in claim 2, wherein N=4.

4. The phase selector/phase interpolator circuit of the clock data recovery circuit as claimed in claim 1, wherein, in each of the two phase selector circuits, two of the N phase selector units receive two first clock signals, and the two first clock signals have a phase difference of 180°, and another two of the N phase selector units receive another two first clock signals, the another two first clock signals have a phase difference of 180°.

5. The phase selector/phase interpolator circuit of the clock data recovery circuit as claimed in claim 4, wherein each of the N phase selector units comprises a first transistor, a second transistor, a third transistor and a fourth transistor;

a first end of the first transistor and a first end of the second transistor are connected to a first end of one of the N first tail current tubes, a second end of the first transistor is connected to a first end of the third transistor, a second end of the second transistor is connected to a first end of the fourth transistor, a control end of the first transistor and a control end of the second transistor are respectively configured to receive a first clock signal, and a phase difference between the first clock signal received by the first transistor and the first clock signal received the second transistor is 180°; and a second end of the third transistor and a second end of the fourth transistor are respectively connected to the current source circuit, and the second end of the third transistor is in connection with a second end of a fourth transistor of another phase selector unit that receives the same two first clock signals, and the second end of the fourth transistor is in connection with a second end of a third transistor of the another phase selector unit that receives the same two first clock signals.

6. The phase selector/phase interpolator circuit of the clock data recovery circuit as claimed in claim 4, wherein the current source circuit comprises a fifth transistor, a sixth transistor, a seventh transistor and a current source; and a first end of the fifth transistor, a first end of the sixth transistor and a first end of the seventh transistor are respectively connected to a positive power supply terminal, a control end of the fifth transistor, a second end of the fifth transistor, a control end of the sixth transistor and a control end of the seventh transistor are connected to the current source, and a second end of the sixth transistor and a second end of the seventh transistor are respectively connected to the two output ends of the phase selector circuit.

7. The phase selector/phase interpolator circuit of the clock data recovery circuit as claimed in claim 6, wherein the comparison circuit comprises a first resistor, a second resistor and a comparator; and a first end of the first resistor and a first end of the second resistor are respectively connected to the second end of the seventh transistor and the second end of the sixth transistor, a second end of the first resistor and a second end of the second resistor are connected to a non-inverting input end of the comparator, an inverting input end of the comparator is configured to receive the reference voltage, and an output end of the comparator is respectively connected to control ends of the N first tail current tubes.

8. The phase selector/phase interpolator circuit of the clock data recovery circuit as claimed in claim 1, wherein the phase interpolator circuit comprises an eighth transistor, a ninth transistor, a tenth transistor, an eleventh transistor, a twelfth transistor, a thirteenth transistor, a fourteenth transistor, a fifteenth transistor, a second tail current tube, a third tail current tube, a third resistor and a fourth resistor;

a first end of the eighth transistor and a first end of the ninth transistor are connected to a first end of the second tail current tube, a control end of the second tail current tube is configured to receive a second bias voltage, a second end of the second tail current tube is grounded, a control end of the eighth transistor and a control end of the ninth transistor are respectively connected to the two output ends of one of the two phase selector circuits, a second end of the eighth transistor is connected to a first end of the tenth transistor, a second end of the ninth transistor is connected to a first end of the eleventh transistor, a control end of the tenth transistor and a control end of the eleventh transistor are both configured to receive the second code signal, a second end of the tenth transistor and a second end of the fourteenth transistor are connected to a first end of the fourth resistor, a second end of the eleventh transistor and a second end of the fifteenth transistor are connected to a first end of the third resistor, and a second end of the third resistor and a second end of the fourth resistor are respectively connected to a positive power supply terminal; and a first end of the twelfth transistor and a first end of the thirteenth transistor are connected to a first end of the third tail current tube, a control end of the third tail current tube is configured to receive a third bias voltage, a second end of the third tail current tube is grounded, a control end of the twelfth transistor and a control end of the thirteenth transistor are respectively connected to the two output ends of another one of the two phase selector circuits, a second end of the twelfth transistor is connected to a first end of the fourteenth transistor, and a second end of the thirteenth transistor is connected to a first end of the fifteenth transistor.

9. A clock data recovery circuit, comprising:

a phase selector/phase interpolator circuit, comprising:

two phase selector circuits, respectively connected to a controller of the clock data recovery circuit, each of the two phase selector circuits configured to select and output one of N first clock signals of different phases received according to a first code signal output by the controller, wherein N≥2, and wherein each of the two phase selector circuits comprises:

N first tail current tubes which are respectively configured to output a tail current of corresponding magnitude according to a first bias voltage, wherein the tail current changes in a positive correlation with the first bias voltage;

N phase selector units, wherein each of the N phase selector units is connected to one of the N first tail current tubes and two output ends of the phase selector circuit, each two of the phase selector units receive two first clock signals, and the first code signal is respectively received by the N phase selector units, and each of the N phase selector units is configured to convert the two first clock signals into two output clock signals according to the first code signal and output the two output clock signals to the two output ends of the phase selector circuit, wherein the two output clock signals have same frequencies and phases as the two first clock signals;

a current source circuit which is connected in series to the two output ends of the phase selector circuit, and the current source circuit serves as a load of the phase selector circuit; and a comparison circuit which is connected to the two output ends of the phase selector circuit and the N first tail current tubes, and configured to compare a common-mode voltage of the two output clock signals with a reference voltage and perform negative feedback regulation on a magnitude of the first bias voltage; and a phase interpolator circuit, respectively connected to the controller and the two phase selector circuits, configured to receive the two first clock signals output from the two phase selector circuits and output a second clock signal after performing a weighted operation on the two first clock signals received according to a second code signal output by the controller.

10. The clock data recovery circuit as claimed in claim 9, wherein one of the two phase selector circuits receives N first clock signals, and the N first clock signals are respectively phase-differentiated with the reference clock by k1*(360°/2N), wherein k1 is 1, 3 2N−1; and another one of the two phase selector circuits receives N first clock signals, and the N first clock signals are respectively phase-differentiated with the reference clock by k2*(360°/2N), wherein k2 is 2, 4 . . . 2N.

11. The clock data recovery circuit as claimed in claim 10, wherein N=4.

12. The clock data recovery circuit as claimed in claim 9, wherein, in each of the two phase selector circuits, two of the N phase selector units receive two first clock signals, and the two first clock signals have a phase difference of 180°, and another two of the N phase selector units receive another two first clock signals, the another two first clock signals have a phase difference of 180°.

13. The clock data recovery circuit as claimed in claim 12, wherein each of the N phase selector units comprises a first transistor, a second transistor, a third transistor and a fourth transistor;

a first end of the first transistor and a first end of the second transistor are connected to a first end of one of the N first tail current tubes, a second end of the first transistor is connected to a first end of the third transistor, a second end of the second transistor is connected to a first end of the fourth transistor, a control end of the first transistor and a control end of the second transistor are respectively configured to receive a first clock signal, and a phase difference between the first clock signal received by the first transistor and the first clock signal received the second transistor is 180°; and a second end of the third transistor and a second end of the fourth transistor are respectively connected to the current source circuit, and the second end of the third transistor is in connection with a second end of a fourth transistor of another phase selector unit that receives the same two first clock signals, and the second end of the fourth transistor is in connection with a second end of a third transistor of the another phase selector unit that receives the same two first clock signals.

14. The clock data recovery circuit as claimed in claim 12, wherein the current source circuit comprises a fifth transistor, a sixth transistor, a seventh transistor and a current source; and a first end of the fifth transistor, a first end of the sixth transistor and a first end of the seventh transistor are respectively connected to a positive power supply terminal, a control end of the fifth transistor, a second end of the fifth transistor, a control end of the sixth transistor and a control end of the seventh transistor are connected to the current source, and a second end of the sixth transistor and a second end of the seventh transistor are respectively connected to the two output ends of the phase selector circuit.

15. The clock data recovery circuit as claimed in claim 14, wherein the comparison circuit comprises a first resistor, a second resistor and a comparator; and a first end of the first resistor and a first end of the second resistor are respectively connected to the second end of the seventh transistor and the second end of the sixth transistor, a second end of the first resistor and a second end of the second resistor are connected to a non-inverting input end of the comparator, an inverting input end of the comparator is configured to receive the reference voltage, and an output end of the comparator is respectively connected to control ends of the N first tail current tubes.

16. The clock data recovery circuit as claimed in claim 9, wherein the phase interpolator circuit comprises an eighth transistor, a ninth transistor, a tenth transistor, an eleventh transistor, a twelfth transistor, a thirteenth transistor, a fourteenth transistor, a fifteenth transistor, a second tail current tube, a third tail current tube, a third resistor and a fourth resistor;

a first end of the eighth transistor and a first end of the ninth transistor are connected to a first end of the second tail current tube, a control end of the second tail current tube is configured to receive a second bias voltage, a second end of the second tail current tube is grounded, a control end of the eighth transistor and a control end of the ninth transistor are respectively connected to the two output ends of one of the two phase selector circuits, a second end of the eighth transistor is connected to a first end of the tenth transistor, a second end of the ninth transistor is connected to a first end of the eleventh transistor, a control end of the tenth transistor and a control end of the eleventh transistor are both configured to receive the second code signal, a second end of the tenth transistor and a second end of the fourteenth transistor are connected to a first end of the fourth resistor, a second end of the eleventh transistor and a second end of the fifteenth transistor are connected to a first end of the third resistor, and a second end of the third resistor and a second end of the fourth resistor are respectively connected to a positive power supply terminal; and a first end of the twelfth transistor and a first end of the thirteenth transistor are connected to a first end of the third tail current tube, a control end of the third tail current tube is configured to receive a third bias voltage, a second end of the third tail current tube is grounded, a control end of the twelfth transistor and a control end of the thirteenth transistor are respectively connected to the two output ends of another one of the two phase selector circuits, a second end of the twelfth transistor is connected to a first end of the fourteenth transistor, and a second end of the thirteenth transistor is connected to a first end of the fifteenth transistor.

17. An electronic device, comprising:

a clock data recovery circuit, comprising:

a phase selector/phase interpolator circuit, comprising:

two phase selector circuits, respectively connected to a controller of the clock data recovery circuit, each of the two phase selector circuits configured to select and output one of N first clock signals of different phases received according to a first code signal output by the controller, wherein N≥2, and wherein each of the two phase selector circuits comprises:

N first tail current tubes which are respectively configured to output a tail current of corresponding magnitude according to a first bias voltage, wherein the tail current changes in a positive correlation with the first bias voltage;

N phase selector units, wherein each of the N phase selector units is connected to one of the N first tail current tubes and two output ends of the phase selector circuit, each two of the phase selector units receive two first clock signals, and the first code signal is respectively received by the N phase selector units, and each of the N phase selector units is configured to convert the two first clock signals into two output clock signals according to the first code signal and output the two output clock signals to the two output ends of the phase selector circuit, wherein the two output clock signals have same frequencies and phases as the two first clock signals;

a current source circuit which is connected in series to the two output ends of the phase selector circuit, and the current source circuit serves as a load of the phase selector circuit; and a comparison circuit which is connected to the two output ends of the phase selector circuit and the N first tail current tubes, and configured to compare a common-mode voltage of the two output clock signals with a reference voltage and perform negative feedback regulation on a magnitude of the first bias voltage; and a phase interpolator circuit, respectively connected to the controller and the two phase selector circuits, configured to receive the two first clock signals output from the two phase selector circuits and output a second clock signal after performing a weighted operation on the two first clock signals received according to a second code signal output by the controller.

18. The electronic device as claimed in claim 17, wherein one of the two phase selector circuits receives N first clock signals, and the N first clock signals are respectively phase-differentiated with the reference clock by k1*(360°/2N), wherein k1 is 1, 3 . . . 2N−1; and another one of the two phase selector circuits receives N first clock signals, and the N first clock signals are respectively phase-differentiated with the reference clock by k2*(360°/2N), wherein k2 is 2, 4 . . . 2N.

19. The electronic device as claimed in claim 18, wherein N=4.

20. The electronic device as claimed in claim 17, wherein, in each of the two phase selector circuits, two of the N phase selector units receive two first clock signals, and the two first clock signals have a phase difference of 180°, and another two of the N phase selector units receive another two first clock signals, the another two first clock signals have a phase difference of 180°.

* * * * *